United States Patent
Graf et al.

(10) Patent No.: US 9,082,816 B2
(45) Date of Patent: Jul. 14, 2015

(54) METHOD AND APPARATUS FOR MOUNTING SEMICONDUCTOR CHIPS

(75) Inventors: Marco Graf, Stans (AT); Dominik Hartmann, Baar (CH); Juergen Stuerner, Volders (AT)

(73) Assignee: ESEC AG, Cham (CH)

( * ) Notice: Subject to any disclaimer, the term of this patent is extended or adjusted under 35 U.S.C. 154(b) by 309 days.

(21) Appl. No.: 13/540,327

(22) Filed: Jul. 2, 2012

(65) Prior Publication Data

US 2013/0008599 A1    Jan. 10, 2013

(30) Foreign Application Priority Data

Jul. 8, 2011    (CH) ...................................... 1148/11

(51) Int. Cl.
H05K 13/04    (2006.01)
H01L 23/00    (2006.01)

(52) U.S. Cl.
CPC ................ H01L 24/75 (2013.01); H01L 24/83 (2013.01); H05K 13/0469 (2013.01); *H01L 24/32* (2013.01); *H01L 2224/32225* (2013.01); *H01L 2224/7565* (2013.01); *H01L 2224/7598* (2013.01); *H01L 2224/83192* (2013.01); *Y10T 156/1089* (2015.01); *Y10T 156/17* (2015.01)

(58) Field of Classification Search
CPC ........................... H05K 13/04; H05K 13/0469
USPC ......... 156/297, 299, 539, 556, 560, 561, 562, 156/566, 567, 571, 572; 29/832, 740, 650
See application file for complete search history.

(56) References Cited

U.S. PATENT DOCUMENTS

| 1,644,044 | A | * | 10/1927 | Urie .............................. 156/561 |
| 4,061,521 | A | * | 12/1977 | Lerner et al. .................. 156/265 |
| 6,053,234 | A | | 4/2000 | Kim et al. |
| 6,416,612 | B1 | * | 7/2002 | Lerner et al. .................. 156/277 |
| 6,929,977 | B2 | * | 8/2005 | Takase et al. ................. 438/106 |
| 2002/0037372 | A1 | | 3/2002 | Sato et al. |
| 2003/0094241 | A1 | | 5/2003 | Huang et al. |
| 2005/0006743 | A1 | | 1/2005 | Kim et al. |
| 2005/0097729 | A1 | | 5/2005 | Bolli |
| 2006/0266792 | A1 | * | 11/2006 | Ko et al. ........................ 228/6.2 |
| 2008/0005881 | A1 | | 1/2008 | Lee et al. |
| 2008/0092370 | A1 | | 4/2008 | Wong et al. |

FOREIGN PATENT DOCUMENTS

EP    2 141 258    1/2010

OTHER PUBLICATIONS

Search Report and Written Opinion for Singapore Patent Application No. 201204156-2, dated Jul. 31, 2013.

* cited by examiner

*Primary Examiner* — John Goff
(74) *Attorney, Agent, or Firm* — Nixon Peabody LLP

(57) ABSTRACT

A semiconductor mounting apparatus has a dispensing station configured to dispense adhesive portions to the substrate locations of a substrate, a bonding station configured to place semiconductor chips on the substrate locations and a transport device configured to transport the substrates along a transport path. The transport device includes a buffer station disposed between the dispensing station and the bonding station. The buffer station is configured to temporarily remove a substrate which is to be transported from the dispensing station to the bonding station, or in reverse direction, from the transport path so that another substrate can be transported by the transport device from the bonding station to the dispensing station, or in reverse direction, respectively.

2 Claims, 6 Drawing Sheets

US 9,082,816 B2

METHOD AND APPARATUS FOR MOUNTING SEMICONDUCTOR CHIPS

PRIORITY CLAIM

Figure 1:
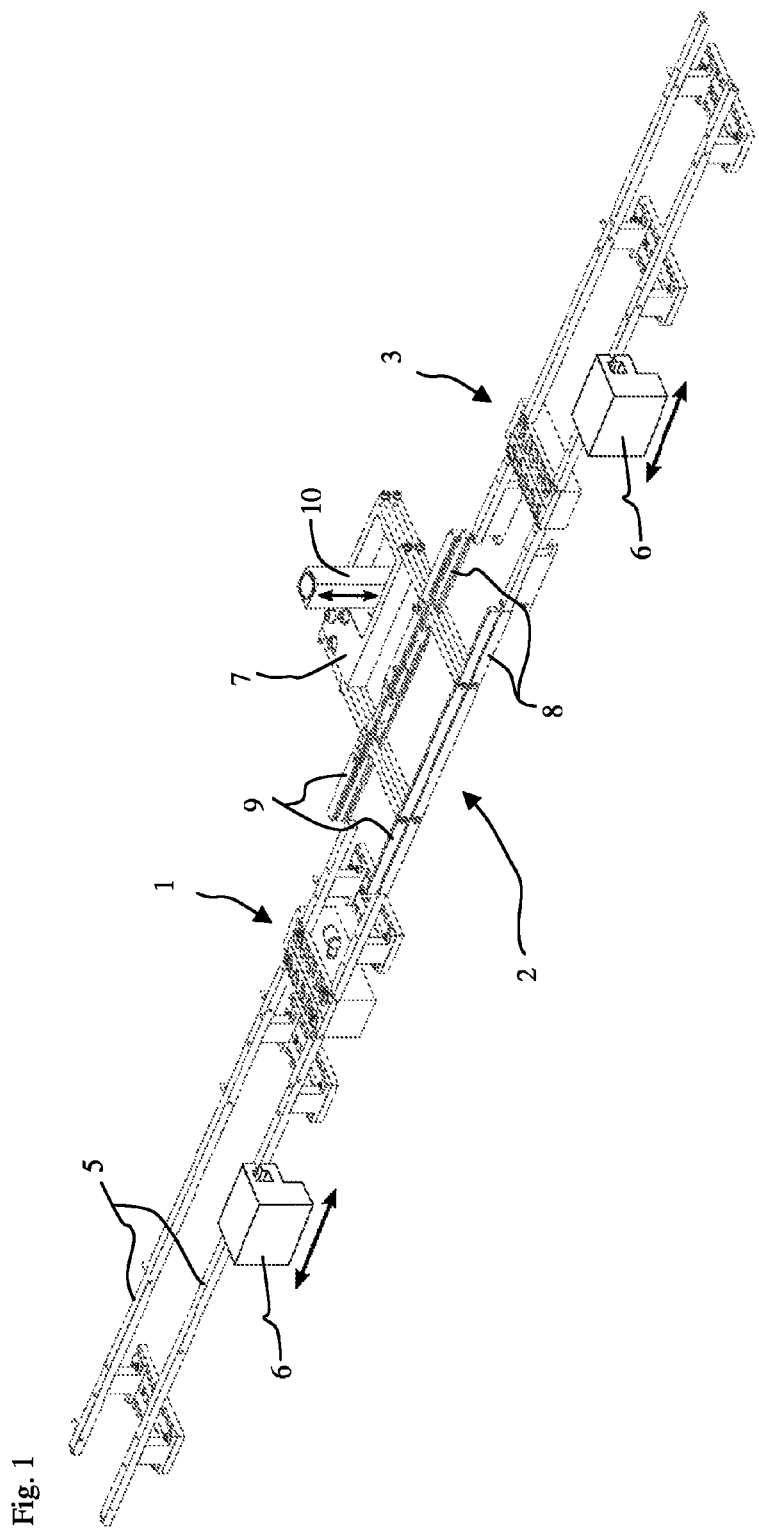

Applicant hereby claims foreign priority under 35 U.S.C §119 from Swiss Patent Application No. 1148/11 filed Jul. 8, 2011, the disclosure of which is herein incorporated by reference.

FIELD OF THE INVENTION

The invention relates to a method and an apparatus for mounting semiconductor chips on substrates. Such automatic mounting apparatuses are known in technical circles as die bonders. They comprise a dispensing station for applying adhesive to the substrate locations of the substrates and a bonding station for placing the semiconductor chips on the substrate locations provided with adhesive.

BACKGROUND OF THE INVENTION

A substrate contains a predetermined number of substrate locations on which respectively one semiconductor chip is mounted. The processing is typically accomplished in such a manner that in a first step at the dispensing station a portion of adhesive is dispensed to each substrate location of the substrate. The substrate is then transported to the bonding station and the semiconductor chips are applied. There are now applications in which several thousand small semiconductor chips are mounted on each substrate. The number of substrate locations can be so large that even at a very high throughput rate (UPH=units per hour) the automatic mounting apparatus requires a time for providing all the substrate locations of the substrate with adhesive that is longer than the so-called "dwell time" or "dry out time" of the adhesive. The dwell time specifies for a certain adhesive how long the maximum time between the application of the adhesive and the placement of the semiconductor chip may be without quality problems occurring. The problem is specifically that a skin forms on a portion of adhesive applied to a substrate location in the course of time which skin negatively influences the behaviour of the adhesive during the mounting of the semiconductor chip. This problem is circumvented nowadays either by providing only a portion of the substrate locations with adhesive and then fitting with semiconductor chips and passing the substrate several times through the die bonder until all the substrate locations are fitted with semiconductor chips or by arranging the dispensing station and the bonding stations as close as possible to one another so that the application of adhesive to one substrate location and the placement of the semiconductor chip thereon can take place with a shorter time delay. These solutions have various disadvantages.

SUMMARY OF THE INVENTION

It is the object of the invention to develop a better solution for these applications.

Each substrate has a predetermined number M of substrate locations which are arranged in rows and columns in the manner of a matrix, where the rows run parallel to the direction of transport and the columns run perpendicular to the direction of transport. Each substrate is divided according to the invention into K substantially same-sized sub-regions, i.e. each sub-region comprises substantially N=M/K substrate locations. The number of sub-regions is at least K=2. The semiconductor chips are mounted with the following steps:

transporting the substrate to the dispensing station,
dispensing an adhesive portion to each of the substrate locations of the first sub-region,
transporting the substrate to the bonding station,
placing semiconductor chips on the substrate locations of the first sub-region,
transporting the substrate back to the dispensing station,
dispensing an adhesive portion to each of the substrate locations of the second sub-region,
transporting the substrate to the bonding station,
placing semiconductor chips on the substrate locations of the second sub-region, and continuing so until all the sub-regions of the substrate are fitted with semiconductor chips.

Here it is the case that one substrate after the other is provided with adhesive portions and fitted with semiconductor chips, where one substrate is always located at the dispensing station and at the same time another substrate is located at the bonding station. In order that an automatic sequence is possible, a buffer station is disposed between the dispensing station and the bonding station, which is configured as a passing place at which one or two substrates to be transported from the dispensing station to the bonding station and one substrate to be transported in the opposite direction from the bonding station to the dispensing station can cross. The buffer station is therefore configured to temporarily receive one or two substrates and remove them from the transport path.

$\tau_1$ designates the mean cycle time required at the dispensing station to apply a portion of adhesive to a substrate location and $\tau_2$ designates the mean cycle time required at the bonding station to place a semiconductor chip on a substrate location. The time $\Delta t_1$ required to provide all the substrate locations of a sub-region with adhesive portions is therefore $\Delta t_1 = N^*\tau_1$. The time $\Delta t_2$ required to place a semiconductor chip on all the substrate locations of a sub-region is therefore $\Delta t_2 = N^*\tau_2$. The time $\Delta t$ which elapses between the application of adhesive to a specific substrate location and the placement of a semiconductor chip at this specific substrate location is therefore the larger of the two times $\Delta t_1$ and $\Delta t_2$, i.e. $\Delta t = $ maximum $(\Delta t_1, \Delta t_2)$, where the transport time from the dispensing station to the bonding station is negligible in comparison. The dwell time $t_D$ is a time provided by the manufacturer of the adhesive which specifies how long the maximum time between application of the adhesive and placement of the semiconductor chip may be without quality problems occurring. In principle, the number K of sub-regions should be as small as possible but selected so that the condition $\Delta t < t_D$ is usually satisfied.

The number K can be determined, for example, as follows:
a) calculate the time $\Delta t_{S1}$ required by the dispensing station to provide all M substrate locations of a substrate with adhesive as $\Delta t_{S1} = M^*\tau_1$,
b) calculate the time $\Delta t_{S2}$ required by the bonding station to fit all M substrate locations of a substrate with a semiconductor chip as $\Delta t_{S2} = M^*\tau_2$,
c) select the time $\Delta t_S$ as the larger of the two times $\Delta t_{S1}$ and $\Delta t_{S2}$, i.e. $\Delta t_S = $ maximum $(\Delta t_{S1}, \Delta t_{S2})$,
d) calculate the ratio $R = \Delta t_S / t_D$,
e) determine the number K either by rounding up the ratio R to the next higher integer or rounding down the ratio R to the next smaller integer.

If the number K is determined by rounding up the ratio R to the next higher integer, then the time which elapses between application of adhesive to one substrate location and the placement of the semiconductor chip on this substrate location is definitely shorter than the dwell time $t_D$. If, however, the ratio R is only somewhat larger than an integer L, e.g. R=L.13 or R=L.23 or is even larger, it is then quite reasonable to determine the number K by rounding the ratio R down to the next smaller integer and specifically because the quality can satisfy the requirements imposed in a specific application despite exceeding the dwell time $t_D$. This decision is at the discretion of the process engineer.

It can be the case that the K sub-regions are not exactly the same size, e.g. because the total number of substrate locations M is not divisible by the number K as a whole number or because one column in each case is to be finish-processed and the number of columns of a substrate is not divisible by the number K as a whole number. It can thus be the case that the K sub-regions are only substantially the same size.

If the K sub-regions into which the substrate is divided are substantially the same size, then it is sufficient if the buffer station is adapted so that one substrate to be transported from the dispensing station to the bonding station and one substrate to be transported in the opposite direction from the bonding station to the dispensing station can cross. In order that substrates divided into different-sized sub-regions, typically K−1 same-size sub-regions and one smaller sub-region, can be processed, the buffer station must be adapted to cross two substrates to be transported from the dispensing station to the bonding station and one substrate to be transported from the bonding station to the dispensing station.

BRIEF DESCRIPTION OF THE DRAWING FIGURES

Figure 2:
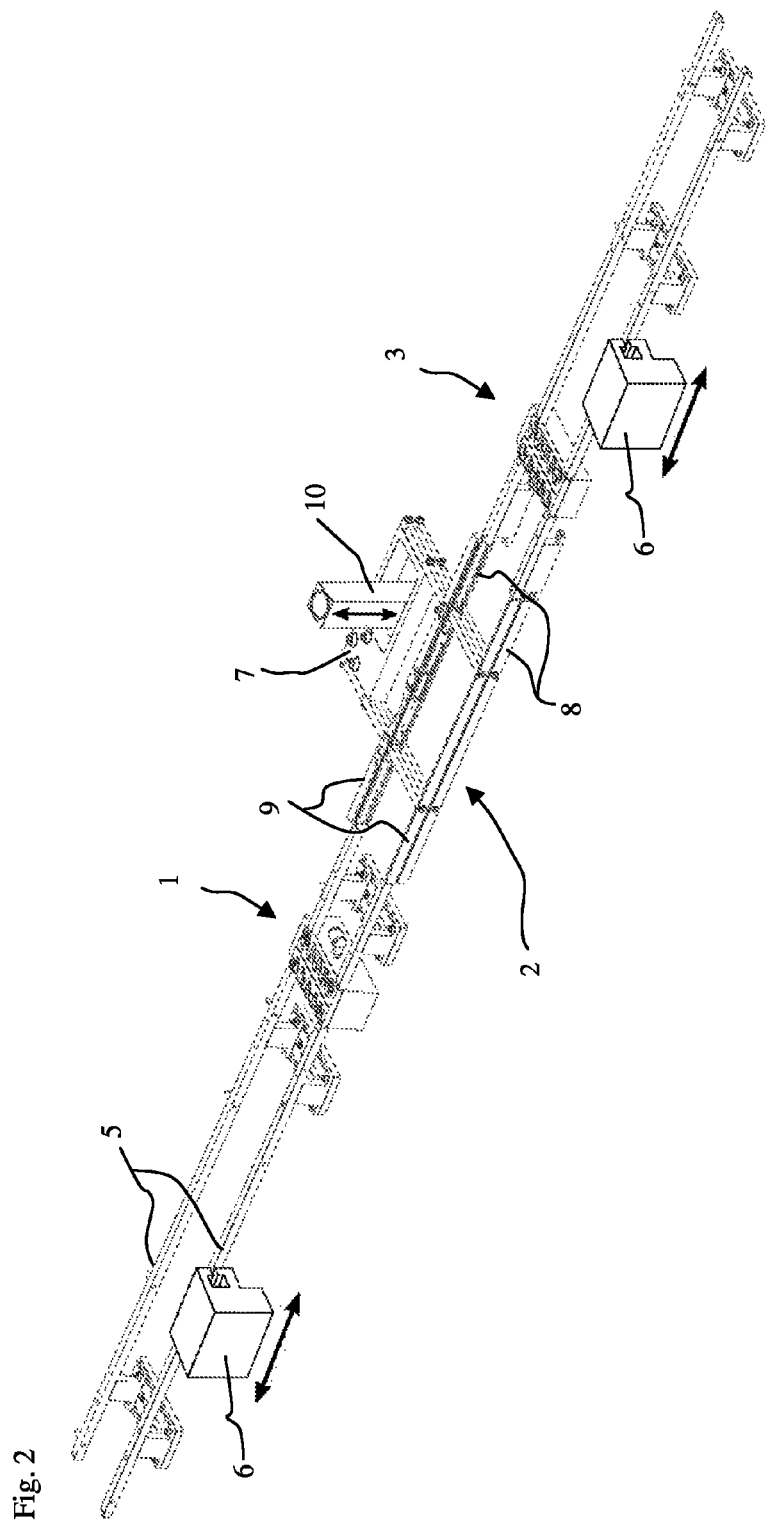
Figure 3:
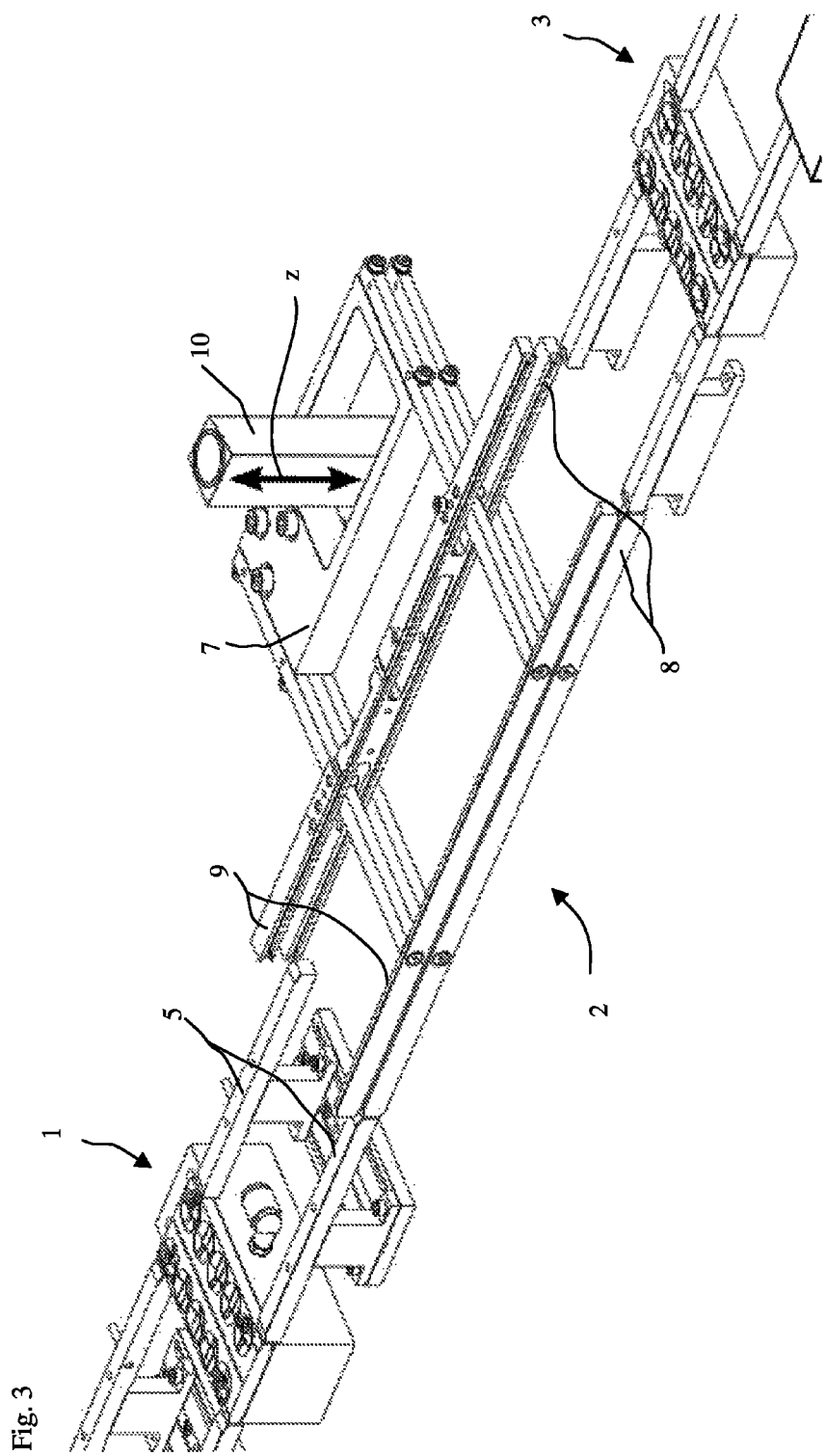
Figure 4:
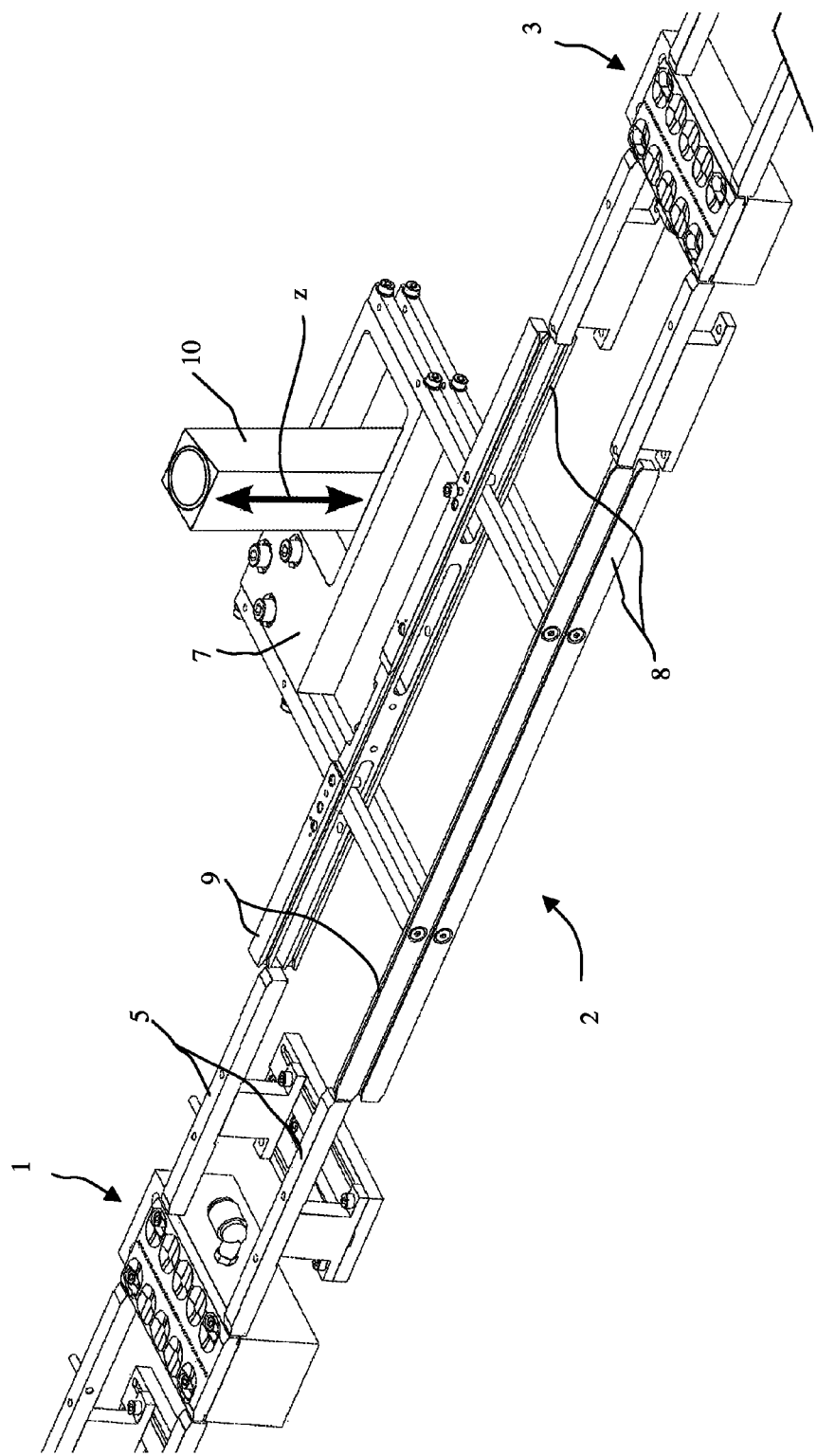
Figure 5:
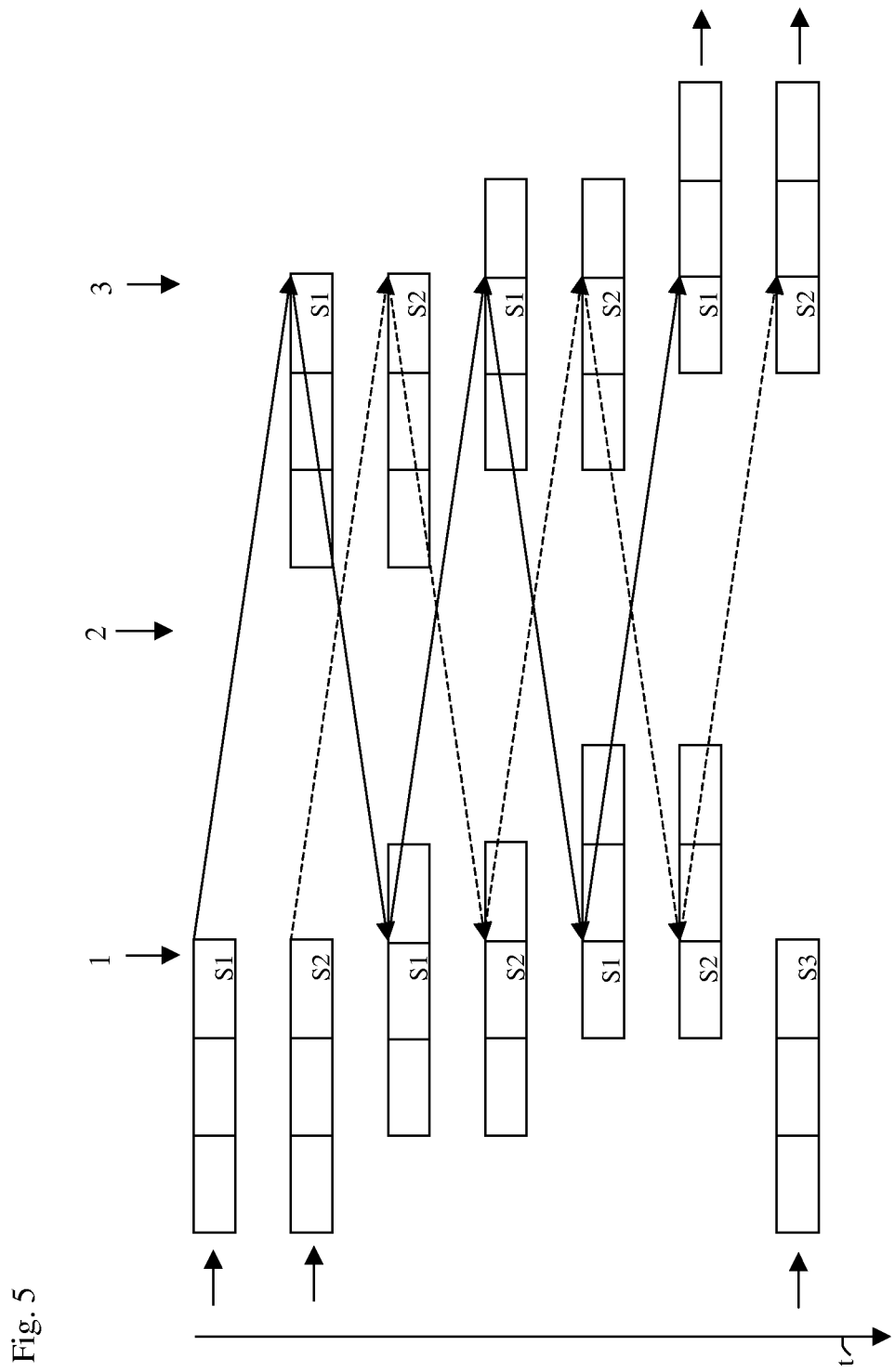
Figure 6:
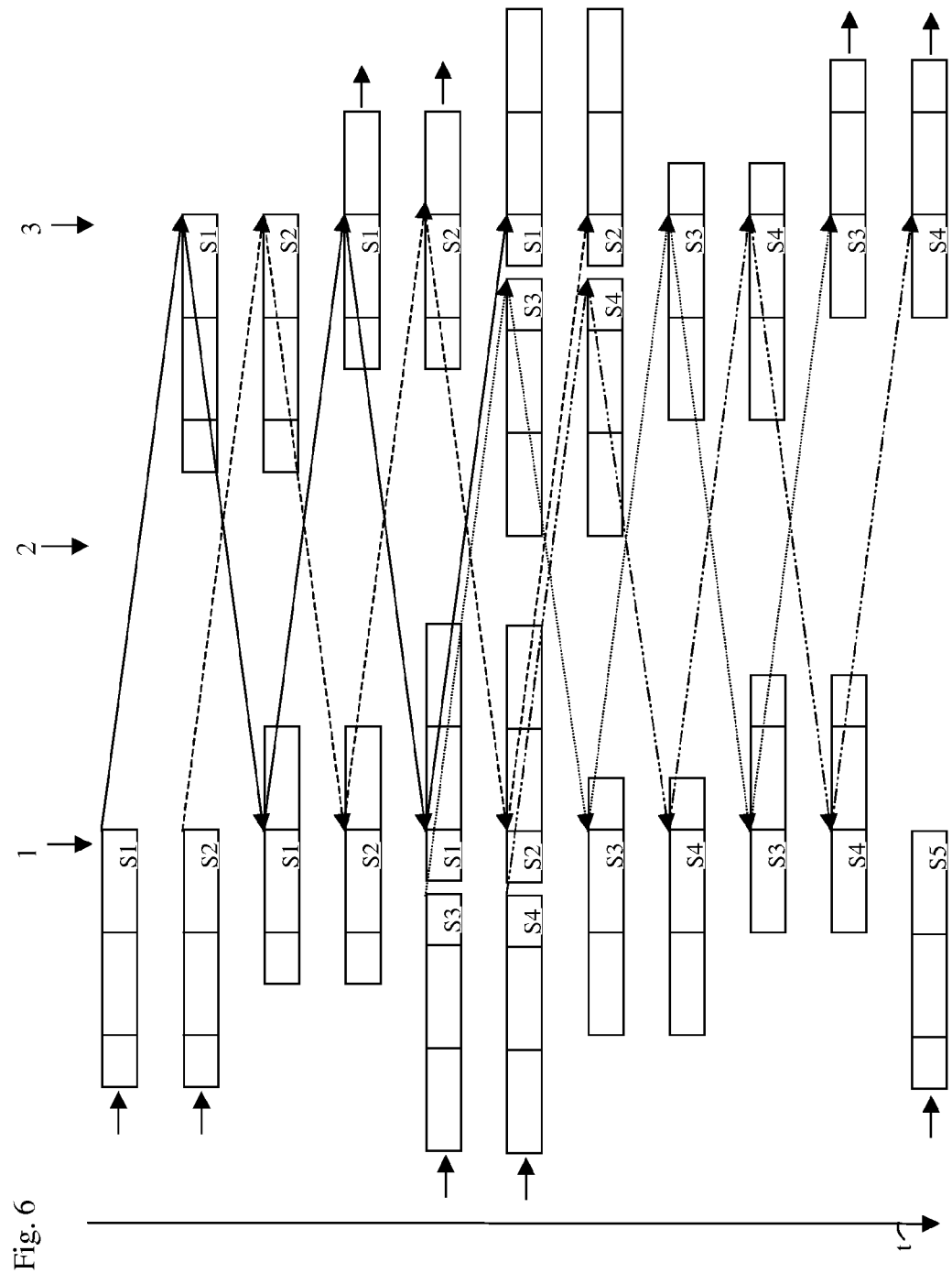

The accompanying drawings, which are incorporated into and constitute a part of this specification, illustrate one or more embodiments of the present invention and, together with the detailed description, serve to explain the principles and implementations of the invention. The figures are not to scale. In the drawings:

FIGS. 1, 2 show the parts of an apparatus for mounting semiconductors on a substrate necessary for understanding the invention, FIGS. 3, 4 show enlarged sections of FIGS. 1 and 2, respectively, and FIGS. 5, 6 show sequence diagrams.

DETAILED DESCRIPTION OF THE INVENTION

FIGS. 1 and 2 show the parts of an apparatus for mounting semiconductors on a substrate, a so-called die bonder, required for understanding the invention. FIG. 3 shows an enlarged section of FIG. 1, FIG. 4 shows an enlarged section of FIG. 2. The apparatus comprises a dispensing station 1, a buffer station 2, a bonding station 3, which are arranged successively in the said sequence, and a transport device 4 for transporting the substrates. In this example, the transport device 4 comprises two parallel-running guide rails 5 on which the substrates rest and at least two clamps 6 movable parallel to or at an acute angle to the guide rails 5, where for transporting each of the clamps 6 clamps respectively one substrate between two clamping jaws and moves it to the desired station. The dispensing station 1 is configured to dispense adhesive to the substrate locations of a substrate. The bonding station 3 is configured to place semiconductor chips on the substrate locations provided with adhesive. The buffer station 2 is configured to remove from the transport path a substrate that has been partially fitted with semiconductor chips at the bonding station 3 and which is to be transported from the bonding station 3 to the dispensing station 1 and temporarily park it so that one successive substrate or two successive substrates to which adhesive portions have been applied at the dispensing station 1 and which must now be fitted with semiconductor chips, can be transported from the dispensing station 1 to the bonding station 3, i.e. past the parked substrate.

In the preferred embodiment shown, the buffer station 2 contains four parallel-running guide rails fastened to a common support 7, i.e. two first guide rails 8 disposed in a first plane and two second guide rails 9 disposed in a second plane located thereabove. The support 7 can be raised and lowered by means of a drive 10 in the height z running perpendicular to the transport path. In this example the buffer station 2 can adopt two positions, i.e. a raised position A (FIG. 1 and FIG. 3) in which the first guide rails 8 are flush with the guide rails 5 of the transport device 4 and a lowered position B (FIG. 2 and FIG. 4) in which the second guide rails 9 are flush with the guide rails 5 of the transport device 4. The superposed guide rails 8, 9 can, as is apparent in FIG. 2 and FIG. 4, be fabricated from one piece of material. The guide rails 8, 9 facing the clamps 6 are preferably formed with a protruding stop, the guide rails 8, 9 facing away from the clamps 6 are preferably formed as grooves.

The buffer station 2 is thus configured to temporarily receive one or two substrates from the transport device and remove them from the transport path, i.e. they can temporarily be parked outside the transport path, so that one or two substrates to be transported from the dispensing station 1 to the bonding station 3 can cross a substrate to be transported in the reverse direction from the bonding station 3 to the dispensing station 1.

FIG. 5 shows a sequence diagram which illustrates by reference to three substrates S1 to S3 how the substrates are processed according to a first exemplary embodiment of the invention in which the K sub-regions have substantially the same number of substrate locations, i.e. about M/K substrate locations. In this example K=3. The location of the dispensing station 1, the location of the buffer station 2 and the location of the bonding station 3 are marked by arrows, t designates the time axis. The buffer station 2 is located in position A. The semiconductor chips are mounted on the substrates as follows:

A1) The first substrate S1 is transported to the dispensing station 1.
B1) The substrate locations of the first sub-region of the substrate S1 are provided with adhesive portions.
C1) The first substrate S1 is transported to the bonding station 3, the second substrate S2 is transported to the dispensing station 1.
D1) The substrate locations of the first sub-region of the substrate S2 are provided with adhesive portions. Parallel to this, the substrate locations of the first sub-region of the substrate S1 are fitted with semiconductor chips.
E1) Exchanging the two substrates S1 and S2 by the steps:
The substrate S1 is transported to the buffer station 2.
The buffer station 2 is brought into position B.
The substrate S2 is transported to the bonding station 3 where it passes the buffer station 2.
The buffer station 2 is brought into position A.
The substrate S1 is transported to the dispensing station 1.
F1) The substrate locations of the second sub-region of the substrate S1 are provided with adhesive portions. Parallel to this, the substrate locations of the first sub-region of the substrate S2 are fitted with semiconductor chips.
G1) Exchanging the two substrates S1 and S2 by the steps:
The substrate S2 is transported to the buffer station 2.
The buffer station 2 is brought into position B.

The substrate S1 is transported to the bonding station 3 where it passes the buffer station 2.

The buffer station 2 is brought into position A.

The substrate S2 is transported to the dispensing station 1.

H1) The substrate locations of the second sub-region of the substrate S2 are provided with adhesive portions. Parallel to this, the substrate locations of the second sub-region of the substrate S1 are fitted with semiconductor chips.

I1) Exchanging the two substrates S1 and S2 as in step E1).

K1) The substrate locations of the third sub-region of the substrate S1 are provided with adhesive portions. Parallel to this, the substrate locations of the second sub-region of the substrate S2 are fitted with semiconductor chips.

L1) Exchanging the two substrates S1 and S2 as in step G1).

M1) The substrate locations of the third sub-region of the substrate S2 are provided with adhesive portions. Parallel to this, the substrate locations of the third sub-region of the substrate S1 are fitted with semiconductor chips.

N1) The substrate S1 is transported to the outlet of the automatic mounting apparatus.

O1) The substrate S2 is transported to the bonding station.

P1) The substrate S3 is transported to the dispensing station 1.

Q1) The substrate locations of the first sub-region of the substrate S3 are provided with adhesive portions. Parallel to this, the substrate locations of the third sub-region of the substrate S2 are fitted with semiconductor chips.

The second substrate S2 is now finish fitted with semiconductor chips and is transported to the outlet of the automatic mounting apparatus. The mounting of the semiconductor chips is continued with substrate S3 and other substrates in the same way.

The step sequence E1 is carried out when the mean cycle time $\tau_1$ of the dispensing station 1 is shorter than the mean cycle time $\tau_2$ of the bonding station 3. When $\tau_1 > \tau_2$, the substrates S1 and S2 are exchanged instead of the step sequence E1 with the following step sequence E1':

The substrate S2 is transported to the buffer station 2.

The buffer station 2 is brought into position B.

The substrate S1 is transported to the dispensing station 1, where it passes the buffer station 2.

The buffer station 2 is brought into position A.

The substrate S2 is transported to the bonding station 3.

The same applies for the step sequence G1.

FIG. 6 shows a sequence diagram which illustrates how the substrates are processed according to a second exemplary embodiment of the invention in which K−1 sub-regions have substantially the same number of substrate locations, and one sub-region has approximately half as many substrate locations (e.g. M=18000, K=3, $N_1=N_2=7200$, $N_3=3600$, where $N_1$ to $N_3$ designate the number of the substrate locations of the three sub-regions). The buffer station 2 is located in position A. The semiconductor chips are mounted on the substrates as follows:

A2) The first substrate S1 is transported to the dispensing station 1.

B2) The substrate locations of the first sub-region of the substrate S1 are provided with adhesive portions.

C2) The first substrate S1 is transported to the bonding station 3, the second substrate S2 is transported to the dispensing station 1.

D2) The substrate locations of the first sub-region of the substrate S2 are provided with adhesive portions. Parallel to this, the substrate locations of the first sub-region of the substrate S1 are fitted with semiconductor chips.

E2) Exchanging the two substrates S1 and S2 as in step E1 or E1' of the first process described.

F2) The substrate locations of the second sub-region of the substrate S1 are provided with adhesive portions. Parallel to this, the substrate locations of the first sub-region of the substrate S2 are fitted with semiconductor chips.

G2) Exchanging the two substrates S1 and S2 as in step G1 or, by analogy with E1', a step G1'.

H2) The substrate locations of the second sub-region of the substrate S2 are provided with adhesive portions. Parallel to this, the substrate locations of the second sub-region of the substrate S1 are fitted with semiconductor chips.

I2) Exchanging the two substrates S1 and S2 as in step E1 or E1'.

K2) The substrate locations of the third sub-region of the substrate S1 are provided with adhesive portions. As soon as this is completed, the substrate S1 is transported to the buffer station 2 and the substrate S3 is transported to the dispensing station 1. The substrate locations of the first sub-region of the substrate S3 are provided with adhesive portions. Parallel to this, the substrate locations of the second sub-region of the substrate S2 are fitted with semiconductor chips.

In order that there is no unproductive empty time either at the dispensing station 1 or at the bonding station 3, the number of substrate locations of the first sub-region of the third substrate S3 is substantially the same as the number of substrate locations of the third sub-region of the first substrate S1. This is also the case with the substrates S2 and S4.

L2) Exchanging the two substrates S1 and S3 with the substrate S2 by:

the substrate S3 is transported to the buffer station 2. The two substrates S1 and S3 are now located one behind the other in the buffer station 2.

The buffer station 2 is brought into position B.

The substrate S2 is transported to the dispensing station 1, where it passes the buffer station 2.

The buffer station 2 is brought into position A.

The substrate S1 is transported to the bonding station 3.

M2) The substrate locations of the third sub-region of the substrate S2 are provided with adhesive portions. As soon as this is completed, the substrate S2 is transported to the buffer station 2. Then adhesive portions are applied to the substrate locations of the first sub-region of the substrate S4. As soon as this is completed, the substrate S4 is transported to the buffer station 2. The two substrates S2 and S4 are now located one behind the other in the buffer station 2. Parallel to this, firstly the substrate locations of the third sub-region of the substrate S1 are fitted with semiconductor chips. As soon as the third sub-region of the substrate S1 is completely fitted, the substrate S1 is transported to the outlet of the automatic mounting apparatus and the substrate S3 is transported from the buffer station 2 to the bonding station 3. The substrate locations of the first sub-region of the substrate S3 are then fitted with semiconductor chips.

N2) Exchanging the substrates S2 and S4 with the substrate S3 by:

The buffer station 2 is brought into position B.

The substrate S3 is transported to the dispensing station 1, where it passes the buffer station 2.

The buffer station 2 is brought into position A.

The substrate S2 is transported to the bonding station 3.

O2) The substrate locations of the second sub-region of the substrate S3 are provided with adhesive portions. Parallel to this, the substrate locations of the third sub-region of the substrate S2 are fitted with semiconductor chips. As soon as the third sub-region of the substrate S2 is completely fitted, the substrate S2 is transported to the outlet of the automatic mounting apparatus and the substrate S4 is transported from the buffer station 2 to the bonding station 3. The substrate locations of the first sub-region of the substrate S4 are then fitted with semiconductor chips.

P2) Exchanging the substrates S3 and S4 by analogy with step E2.

Q2) The substrate locations of the third sub-region of the substrate S3 are provided with adhesive portions. Parallel to this, the substrate locations of the second sub-region of the substrate S4 are fitted with semiconductor chips.

etc.

These process steps describe the basic principles of the two processes characteristic of the invention. The person skilled in the art will coordinate the individual steps or sub-steps to one another on the basis of his knowledge so that the processing time for the substrates is minimal, i.e. the throughput UPH of the automatic mounting apparatus is as high as possible.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for mounting semiconductor chips, in which at a dispensing station one adhesive portion after the other is dispensed to substrate locations of a substrate and at a bonding station one semiconductor chip after the other is placed on the substrate locations provided with adhesive, the method comprising dividing the substrates into at least two sub-regions, and mounting the semiconductor chips on each such substrate according to the following steps:

A) transporting the substrate to the dispensing station,
B) dispensing an adhesive portion only to each of the substrate locations of the first sub-region of the substrate, and then
C) transporting the substrate to the bonding station, and then
D) placing semiconductor chips only on the substrate locations of the first sub-region of the substrate, and then
E) transporting the substrate back to the dispensing station, and then
F) dispensing an adhesive portion only to each of the substrate locations of the second sub-region of the substrate, and then
G) transporting the substrate to the bonding station, and then
H) placing semiconductor chips only on the substrate locations of the second sub-region of the substrate and transporting the substrate to an outlet if the number of the sub-regions is two or repeating steps E to H for each further sub-region of the substrate, wherein the substrate in step E crosses in a buffer station disposed between the dispensing station and the bonding station one or two successive substrates which are transported from the dispensing station to the bonding station.

2. The method according to claim 1, wherein the at least two sub-regions of each substrate contain substantially the same number of substrate locations.

* * * * *